(12) United States Patent
Abe et al.

(10) Patent No.: US 7,714,224 B2
(45) Date of Patent: May 11, 2010

(54) PHOTOVOLTAIC POWER GENERATION MODULE AND PHOTOVOLTAIC POWER GENERATION SYSTEM EMPLOYING SAME

(75) Inventors: Takao Abe, Gunma (JP); Naoki Ishikawa, Gunma (JP)

(73) Assignees: Shin - ETSU Chemical Co., Ltd., Tokyo (JP); Shin - ETSU Handotai Co., Ltd., Tokyo (JP)

( * ) Notice: Subject to any disclaimer, the term of this patent is extended or adjusted under 35 U.S.C. 154(b) by 490 days.

(21) Appl. No.: 11/660,701

(22) PCT Filed: Jul. 15, 2005

(86) PCT No.: PCT/JP2005/013130

§ 371 (c)(1),
(2), (4) Date: Feb. 21, 2007

(87) PCT Pub. No.: WO2006/027898

PCT Pub. Date: Mar. 16, 2006

(65) Prior Publication Data

US 2007/0261731 A1 Nov. 15, 2007

(30) Foreign Application Priority Data

Sep. 3, 2004 (JP) .............................. 2004-005305
Dec. 24, 2004 (JP) .............................. 2004-373237

(51) Int. Cl.
  *H01L 31/05* (2006.01)
  *H01L 31/0352* (2006.01)
(52) U.S. Cl. .............................. 136/244; 257/E31.038; 257/E25.004
(58) Field of Classification Search ......... 136/243–265; 438/57–98
See application file for complete search history.

(56) References Cited

U.S. PATENT DOCUMENTS 4,313,023 A   1/1982   Stephens
4,315,163 A * 2/1982   Bienville ..................... 307/66

FOREIGN PATENT DOCUMENTS

| EP | 1 480 277 A1 | 11/2004 |
| JP | 356108282 A * | 8/1981 |
| JP | 10-110255 | 4/1998 |
| JP | 11298023 * | 10/1999 |
| JP | 2005-123527 | 5/2005 |
| WO | WO 03/073516 A1 * | 9/2003 |

OTHER PUBLICATIONS

Supplementary European Search Report dated Jan. 16, 2008.
Microsol Power (P) Ltd., "Microsol Mono-crystalline Solar Cells;" http://www.microsolpower.com/home.asp./Discussed in the specification, Jan. 23, 2007.
Explanation of circumstances concerning accelerated examination of Japanese Patent Application No. Hei 10-110255 dated Jun. 10, 2004 with English abstract (3 Sheets total.).
Office Action mailed on Mar. 22, Heisei 17 (2005) from the JPO for the Japanese Patent Application No. 2004-373237.

* cited by examiner

*Primary Examiner*—Basia Ridley
*Assistant Examiner*—Christina Chern
(74) *Attorney, Agent, or Firm*—Kratz, Quintos & Hanson, LLP

(57) ABSTRACT

A photovoltaic power generation module that can make use of arcuate cells and a photovoltaic power generation system employing such a module are disclosed. The photovoltaic power generation module may include arcuate cells divided from a disk-shaped single crystal silicon photovoltaic power generation cell. The arcuate cells may have a circular arc with a central angle of 90°. The arcuate cells may have a grid-perpendicular to the chord and at least one busbar perpendicular to the grid. The arcuate cells may be arrayed in a lattice pattern, the arcuate cells having an area of 28 to 65 cm² and 14 to 42 thereof being arrayed.

16 Claims, 12 Drawing Sheets

PHOTOVOLTAIC POWER GENERATION MODULE AND PHOTOVOLTAIC POWER GENERATION SYSTEM EMPLOYING SAME

TECHNICAL FIELD

The present invention relates to a photovoltaic power generation module formed by arraying a large number of single crystal silicon photovoltaic power generation cells, and to a photovoltaic power generation system.

BACKGROUND ART

Conventionally, a photovoltaic power generation cell (also called a 'solar cell' or a 'cell') is produced from a rectangular polycrystalline silicon wafer that has been sliced from a rectangular parallelepiped polycrystalline silicon ingot. Compared with solar cells employing polycrystalline silicon or amorphous silicon, solar cells employing a semiconductor single crystal silicon wafer have higher energy conversion efficiency, and since the cost of single crystal silicon wafers is becoming relatively low, they will be the mainstay of solar cells that will be widespread in the future. In this case, the solar cell is produced using a disk-shaped wafer that has been sliced from a cylindrical ingot.

For example, a single crystal wafer obtained by slicing a semiconductor single crystal ingot obtained by the Czochralski method (hereinafter, simply called the 'CZ method') or the floating zone melting method (hereinafter, simply called the 'FZ method') has a disk shape. A high module packing ratio, where the module packing ratio is defined as the proportion of the total area of photovoltaic power generation cells relative to the plane area of a photovoltaic power generation module (hereinafter, also called a 'solar cell module' or a 'module'), cannot be achieved if solar cells are merely arranged on the plane without being changed in shape from their disk form.

In order to improve the actual energy conversion efficiency based on the plane area of the module, it is necessary to improve this module packing ratio. As a technique for increasing the module packing ratio, there is a generally well-known method in which cells are machined into a rectangular shape and made into an array. However, this method has the problem that, since the disk-shaped semiconductor single crystal wafer is cut into a rectangular shape, loss of arcuate-shaped crystal occurs.

As a technique that can solve the two problems of a low module packing ratio and crystal loss, a method has been disclosed in which a solar cell module is produced using arcuate cells formed when a square cell is cut out from a disk-shaped solar cell as disclosed in, for example, WO03/073516A1. Furthermore, a pattern that seems to be formed by arraying arcuate cells remaining after cutting out so-called pseudo-square cells has been disclosed on the internet, for example, in an article titled "Microsol Mono-crystalline Solar Cells" of unknown publication date and unknown author (Microsol Power (P) Ltd.; retrieved on Aug. 4, 2004) that can be located at <URL:http://www.microsolpower.com/home.asp>.

On the other hand, one crystalline silicon photovoltaic power generation cell generates a voltage of about 0.5 V in an operational state, regardless of its area. When currently popular 15 cm square cells are used, in order to generate a voltage of about 210 V, which is the input voltage of a widespread inverter for converting DC to AC, it is necessary to employ a photovoltaic power generation system in which a total of 420 cells are connected in series. When formation of an interconnectable module is attempted only from 15 cm square cells, the area of the module becomes about 12 $m^2$, and it is not practical to produce such a huge module and install it on a roof, etc. A method is therefore employed in which, for example, twelve 1 m square modules are connected in series. Even if subdivided modules are installed in this way, when installation of a photovoltaic power generation system having a unit total area of 12 $m^2$ is attempted on a roof, a dead space (non-occupied area) in which no module can be placed is often formed. Moreover, the weight of one module is as heavy as 15 kg, thus making installation on a roof difficult.

When cells were first produced, they were 10-cm square, then 12.5-cm square, and the 15-cm square cell is currently dominant. The productivity has increased by 2.25 times due to the increase in cell area, and 20-cm square cells are currently produced. However, in order to further popularize photovoltaic power generation systems and make use of single crystal silicon solar cells effectively, it is desirable to improve the proportion of the total module area relative to the effective area for installation on a south-facing roof (module coverage ratio, hereinafter also called simply 'coverage ratio') and simplify the installation procedure for a photovoltaic power generation system.

DISCLOSURE OF INVENTION

Problems to be Solved by the Invention

One object of the present invention is to provide a photovoltaic power generation module that can solve the above-mentioned problems, and a photovoltaic power generation system employing same. That is, it is to provide a photovoltaic power generation module that eliminates the loss from a disk-shaped single crystal wafer and can make full use of an arcuate cell, which has not until now been utilized effectively, and to provide a photovoltaic power generation system employing same.

It is another object to provide a photovoltaic power generation module having a high operating voltage per unit area (also called 'area voltage'), and a photovoltaic power generation system employing same.

It is yet another object of the present invention to provide a photovoltaic power generation module that can increase as much as possible the module coverage ratio relative to the effective area for installation on a roof (the area of a south-facing roof on which strong sunlight falls), and a photovoltaic power generation system employing same.

Means for Solving the Problems

The above-mentioned objects can be accomplished by the photovoltaic power generation module described in (1) to (6) below and the photovoltaic power generation system described in (7) to (11) below.

(1) A photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid perpendicular to the chord and at least one busbar perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm², 14 to 42 thereof being arrayed, (2) a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid perpendicular to the chord and at least one busbar perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm², 14 to 42 thereof being arrayed, (3) a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid perpendicular to the chord and at least one busbar perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm², 140 to 440 thereof being arrayed, (4) a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid perpendicular to the chord and at least one busbar perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm², 140 to 440 thereof being arrayed, (5) the photovoltaic power generation module according to any one of (1) to (4), wherein the busbars of the arcuate cells are arranged in a substantially straight line, (6) the photovoltaic power generation module according to any one of (1) to (5), wherein the arcuate cells have an auxiliary electrode extending from the busbar so as to intersect the grid within a region in which the grid provided on the arcuate cell does not intersect the busbar, (7) a photovoltaic power generation system, wherein the photovoltaic power generation module according to any one of (1) to (6) is disposed in at least one part thereof, (8) a photovoltaic power generation system, wherein there are arranged the photovoltaic power generation module according to (1) and/or (2), and a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm², 14 to 42 thereof being arrayed, or a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm², 14 to 42 thereof being arrayed, (9) a photovoltaic power generation system, wherein there are arranged the photovoltaic power generation module according to (3) and/or (4), and a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm², 140 to 440 thereof being arrayed, or a photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm², 140 to 440 thereof being arrayed,

(10) a photovoltaic power generation system for a roof, wherein one or more of the modules according to any one of (1) to (6) and a solar inverter are electrically connected, the module being fixed to the roof,

(11) the photovoltaic power generation system according to (10), wherein it is of a grid connection type.

Effects of the Invention

In accordance with the present invention, the loss from a single crystal wafer can be reduced by the use of a module exploiting arcuate cells, which have not been utilized effectively in the art. In particular, by providing an entire disk-shaped single crystal silicon substrate in advance with a grid electrode and a busbar electrode necessary for all arcuate cells and then cutting it into a square cell, it becomes possible to utilize effectively the arcuate cells, which would otherwise be disposed of, for formation of a module.

Furthermore, by the use of a photovoltaic power generation module having a high operating voltage per unit area (area voltage), it becomes possible to install a photovoltaic power generation system occupying a high proportion of the effective area for installation, thus improving the module coverage ratio. Moreover, it becomes possible for the photovoltaic power generation module to be installed in a complicated or small area, and the installation procedure also becomes easy. Furthermore, when it is installed in a location where a roof is partially shaded in the morning or evening, it is possible to build a photovoltaic power generation system having a high module coverage ratio in a place that is free from being shaded so that the system can generate power throughout the period of daylight.

Furthermore, compared with a module having a low area voltage, only a small current flows in a module having a high area voltage, thus reducing the cross-sectional area of a wiring material and suppressing power loss due to heat generation.

Compared with an arcuate cell having a large number of grid lines parallel to a chord, a high voltage module in which arcuate cells having a large number of grid lines perpendicular to a chord are arrayed can improve the module packing ratio by 1% or greater.

Figure 1:
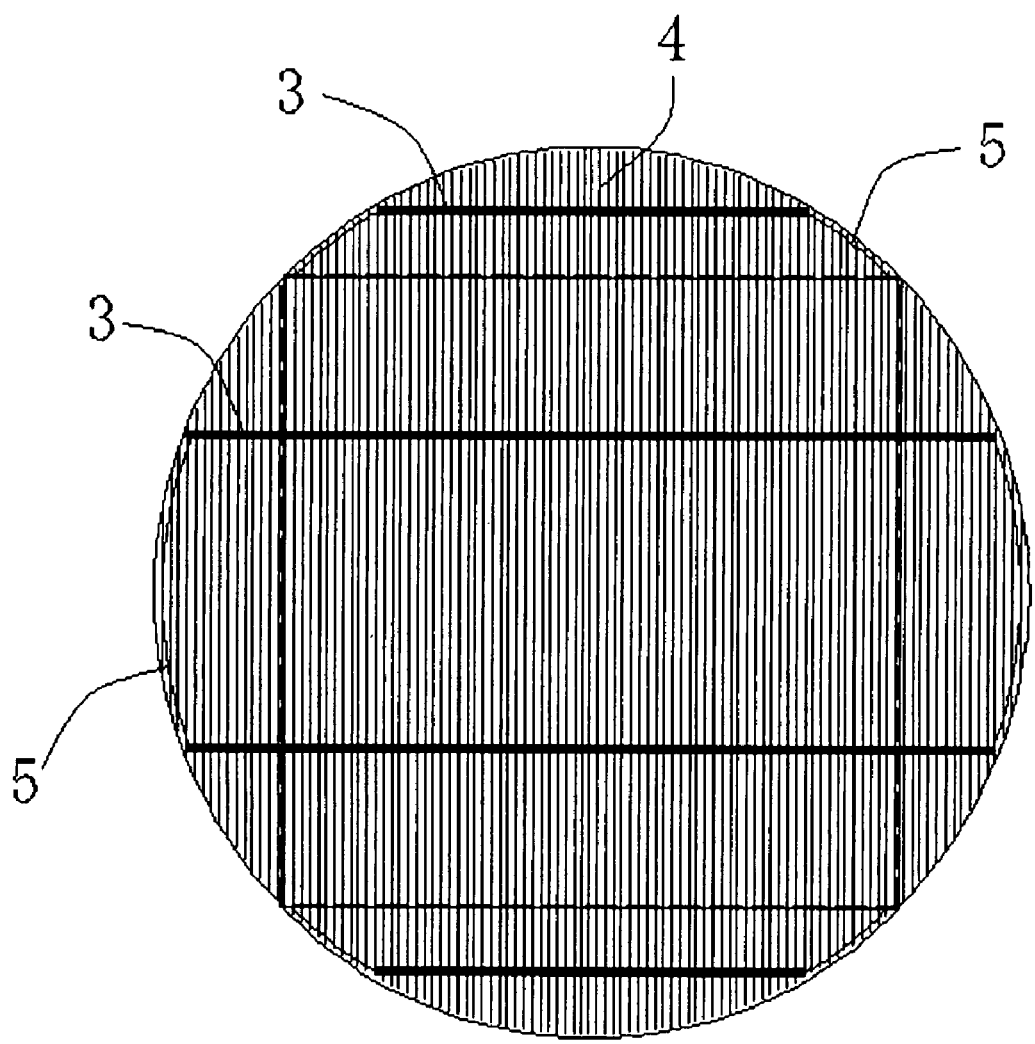
FIG. 1 is a schematic plan view showing one example of a photovoltaic power generation cell prior to cutting.

| Explanation of Reference Numerals and Symbols | |
|---|---|
| 1 | First arcuate cell |
| 2 | Second arcuate cell |
| 3 | Busbar |
| 4 | Grid |
| 5 | Auxiliary electrode |
| 10 | Square cell |
| 20 | Array |
| 21 | Dead space |
| 31 | Square standard cell module |
| 32 | Arcuate cell module |
| 40 | Shade occurring temporarily during daytime |

BEST MODE FOR CARRYING OUT THE INVENTION

The present invention is explained in detail below by reference to the drawings as appropriate.

A first aspect of the present invention relates to a photovoltaic power generation module, this module being formed from congruent arcuate cells.

A second aspect of the present invention relates to a photovoltaic power generation system, this system including the above-mentioned module and being formed by adding an inverter.

The photovoltaic power generation module is produced via a step of producing a single crystal wafer, which becomes a substrate, a step of producing photovoltaic power generation cells (cells), and a step of arraying the cells to thus form a module. The constitution of the module is explained below in this order of steps.

The single crystal wafer, which becomes a substrate, is briefly explained. As a photovoltaic power generation wafer, which becomes a substrate, a silicon single crystal wafer is used. This silicon single crystal wafer may be obtained by slicing a single crystal cylindrical ingot obtained by the previously mentioned CZ method or FZ method. When a silicon single crystal rod is first produced by the CZ method, etc., the silicon single crystal rod is prepared as a p-type conductivity type by adding, for example, gallium or boron. It is also possible to prepare an n-type conductivity type FZ or CZ silicon single crystal rod by adding phosphorus (P).

The single crystal ingot thus obtained is cut into a block having a predetermined resistivity range, and further thinly cut (sliced) so as to have a thickness of, for example, on the order of 150 to 300 μm. By immersing the silicon single crystal wafer (also called simply a 'wafer') that has been cut in an etching solution, both faces thereof are chemically etched. This chemical etching step is carried out in order to remove a damaged layer formed on the surface of the silicon single crystal wafer in the cutting step. Removal of this damaged layer by chemical etching may be carried out by means of, for example, an aqueous solution of an alkali such as NaOH or KOH or an aqueous solution of a mixed acid of hydrofluoric acid, nitric acid, and acetic acid. Subsequently, for the purpose of reducing energy loss due to surface reflection or for the purpose of efficiently trapping light in the interior of a photovoltaic power generation cell by utilizing repetitive reflection, the surface of the silicon on which light shines (first principal surface) is chemically etched so as to form on the first principal surface a textured structure in which the outer face is formed from a large number of pyramidal projections having a (111) face (texturing step). Such a textured structure may be formed by anisotropically etching a (100) face of a silicon single crystal using an etching solution of sodium hydroxide, etc. mixed with an aqueous solution of hydrazine. The arcuate cell used in the present invention is produced by the use of a wafer produced via the above-mentioned steps, which becomes a photovoltaic power generation substrate.

When a wafer is produced as a photovoltaic power generation substrate, a polishing step is often omitted, and a damaged layer of the sliced wafer is removed directly by chemical etching and it is then subjected to texture etching, or removal of the damaged layer by chemical etching and the texturing step may be carried out simultaneously.

The solar cell used in the present invention is a semiconductor comprising a photoelectric conversion portion that includes a pn junction or a pin junction in its interior.

A step of producing the photovoltaic power generation cell is now explained.

Among the above-mentioned single crystal wafers, in the case of the p-type conductivity type, a p-n junction is formed by forming a diffusion layer of an n-type dopant on the first principal surface side of the wafer. The depth of the p-n junction from the principal surface of the wafer is typically on the order of 0.2 to 0.5 μm. The diffusion layer of the n-type dopant is formed by diffusing, for example, phosphorus (P) from the principal surface of a p-type silicon single crystal wafer.

In the case of the n-type conductivity type, a p-n junction is formed by forming a diffusion layer of a p-type dopant on the first principal surface side of the wafer. The depth of the p-n junction from the principal surface of the wafer is typically on the order of 0.2 to 0.5 μm. The diffusion layer of the p-type dopant is formed by diffusing, for example, boron (B) or antimony (Sb) from the principal surface of an n-type silicon single crystal wafer.

The wafer having a p-n junction formed thereon further has an anti-reflection film formed on the first principal surface in order to reduce photoenergy loss due to light reflection and is then provided with electrodes that are in direct contact with the wafer on the first principal surface and a second principal surface, which is on the reverse of the first principal surface. A grid of the first principal surface is made to open or run through the anti-reflection film and then made to directly contact the wafer to thus form an electrode, thereby giving a disk-shaped photovoltaic power generation cell. As an alternative method, an anti-reflection film may be formed after a grid and a busbar are provided on the first principal surface by screen printing. On the other hand, an electrode on the second principal surface side covers substantially the entire face of the second principal surface. After electrodes necessary for the two principal surfaces are formed, a solar cell that keeps the shape of the disk-shaped silicon single crystal wafer is obtained. The anti-reflection film is formed from a transparent material having a refractive index different from silicon, and it can be, for example, a silicon nitride film, a silicon oxide film, or a titanium oxide film.

The electrode on the first principal surface side (light-receiving face) is, for example, a fine finger electrode in order to increase the efficiency with which light enters the p-n junction and, furthermore, in order to collect electricity accumulated in a large number of finger electrodes and reduce the internal resistance, thick linear busbar electrodes (hereinafter, also called simply 'busbars') are provided at appropriate intervals. The plurality of finger electrodes are provided in parallel to each other to thus form a fine linear grid electrode (also called simply a 'grid'), and the busbar electrodes are disposed perpendicular to the finger electrodes. It is also preferable to extend an auxiliary electrode from the busbar in a region in, which the grid provided on the arcuate cell does not intersect the busbar so that the auxiliary electrode intersects the residual grid.

FIG. 1 is a plan view showing one example of the photovoltaic power generation cell prior to cutting. A specific example of the surface collecting electrodes provided on the light-receiving face is shown in relation to the positions of the square cell and the arcuate cells. The wafer from which the arcuate cells used in the present invention is cut may be provided with, for example, 4 parallel busbar electrodes and a grid electrode as illustrated in FIG. 1. The busbar electrodes are equipped with an auxiliary electrode. In the present invention, it is preferable not to employ a grid having an OECO (Obliquely Evaporated Contact; also described in JP-A-2002-305313 (JP-A denotes a Japanese unexamined patent application publication)) structure, which is described in Patent Publication 1 above, and it is preferable as described later for the grid and the busbar to be formed by screen printing a silver paste on the first principal surface.

On the other hand, although not illustrated, the electrode on the second principal surface side covers substantially the entire face of the second principal surface. Furthermore, when the thickness of the substrate is reduced for the purpose of making the cell lightweight, it is possible to form a back surface field layer that is of the same conductivity type as the substrate and has a higher density, in order to prevent recombination and annihilation of minority carriers in the electrode on the second principal surface side.

The photovoltaic power generation cell prior to cutting has a disk shape in which the shape of the wafer is maintained as illustrated in FIG. 1. This is sliced in the thickness direction to thus give arcuate cells used in the module of the present invention.

Figure 2:
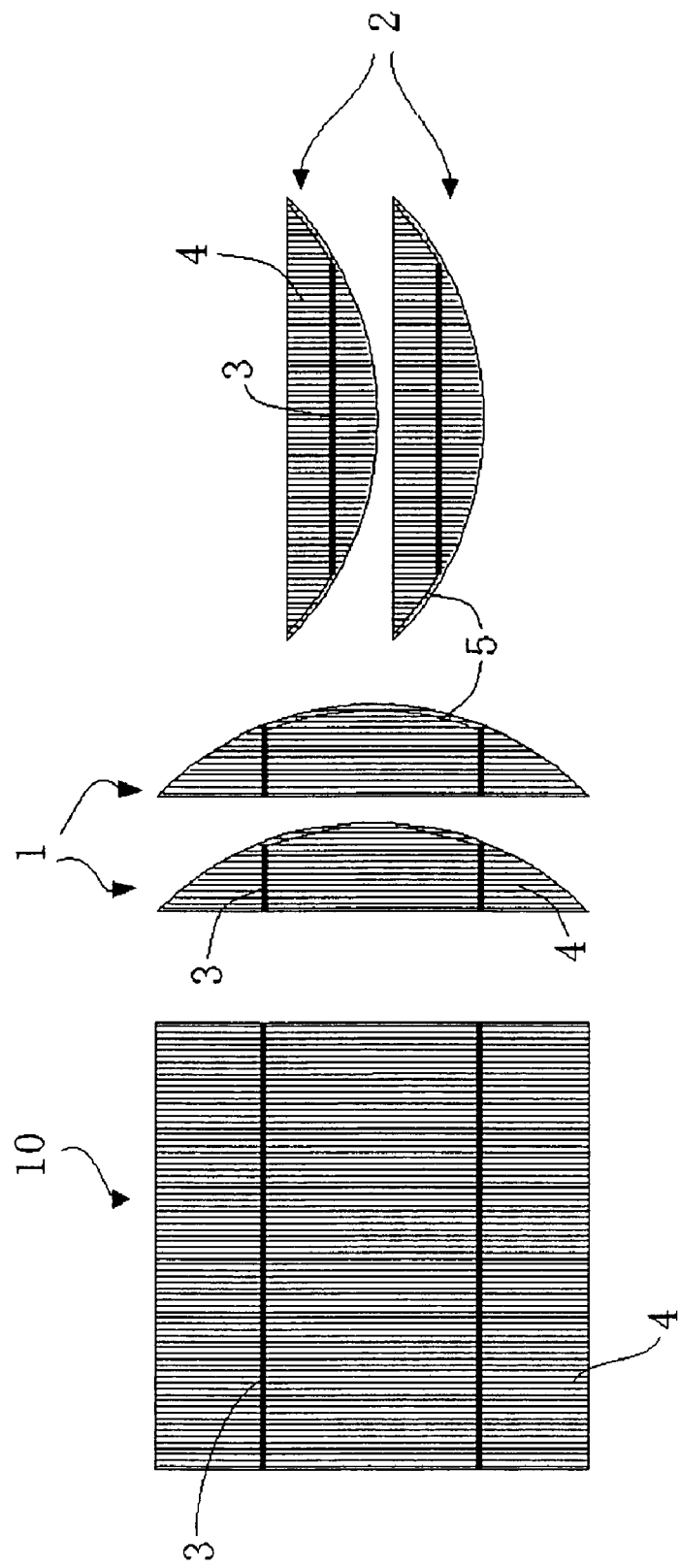
FIG. 2 is a schematic plan view showing one square cell and four arcuate cells obtained by cutting the photovoltaic power generation cell shown in FIG. 1.

FIG. 2 is a plan view showing one square cell and four arcuate cells obtained by cutting the solar cell shown in FIG. 1. As shown in FIG. 2, in addition to one square cell 10, one pair each of two types of arcuate cells 1 and 2, which differ in the direction of grids relative to the respective chord are obtained from one disk-shaped cell. In order to simplify the following explanation, these two types of arcuate cells are called for convenience a 'first arcuate cell 1' and a 'second arcuate cell 2'. Both the first arcuate cell 1 and the second arcuate cell 2 have a circular arc with a central angle of 90°. The first arcuate cell 1 has grid lines that are parallel to the chord and at least two busbars that are perpendicular to the chord. In contrast thereto, the second arcuate cell 2 has grid lines that are perpendicular to the chord and at least one busbar that is parallel to the chord.

A busbar electrode 3 is provided on the disk-shaped photovoltaic power generation cell in a region corresponding to the second arcuate cell. It is preferable for it to be provided at a position that is exactly at the middle of the height of the arcuate cell and parallel to the chord. This busbar 3 is a straight line that runs through the midpoint connecting the midpoint of the chord and the midpoint of the arc and is parallel to the chord. That is, the busbar electrode 3 of the second arcuate cell is preferably provided so as to pass through the middle of the largest width of the second arcuate cell while being parallel to the chord thereof. The busbar electrode 3 is provided at the same position for the two congruent second arcuate cells cut from one disk-shaped cell. Providing it at this position allows the busbars to be arranged on a substantially straight line in a cell array used in the present invention, thereby making electrical connection easy.

The busbar and the grid may be formed by printing or vapor deposition, and it is preferable to form them by screen printing a silver paste, etc. since it is simple.

For the area of the second arcuate cell defined in the present invention, it is preferable to employ one busbar having a width of 0.5 to 2 mm, and the width is more preferably 0.7 to 1.5 mm. The width of the grid is preferably 50 to 250 µm, and more preferably 60 to 150 µm. It is preferable to provide a grid with intervals of 1.5 to 4 mm.

For both the arcuate cells, it is preferable to attach an auxiliary electrode to the busbar electrode. By providing an auxiliary electrode in a region in which the busbar electrode does not intersect the grid, it is possible to increase the efficiency of current collection. In the second arcuate cell, it is preferable to provide an auxiliary electrode at opposite extremity regions, where the busbar does not intersect the grid, and to make it intersect the residual busbar and connect it to the busbar.

It is also preferable in the first arcuate cell for the busbar electrode to be provided at a position such that when the arcuate cells are arrayed to give a photovoltaic power generation module the busbar electrodes come on a substantially straight line.

Each first arcuate cell is preferably provided with at least two busbar electrodes, and for an area corresponding to the arcuate cell of the present invention, two busbars having a width of 0.5 to 2 mm are sufficient. A preferred width for the busbar is the same as that for the second arcuate cell. These two busbar electrodes are preferably provided at an equal distance from the midpoint of the chord and perpendicular to the chord.

The square cell obtained when cutting the arcuate cells is an inscribed square whose diagonal length substantially coincides with the diameter of the disk-shaped photovoltaic power generation cell, all of the arcuate cells having a circular arc of ¼ of the circumference and a central angle of 90°. It is not a preferred embodiment to cut out a pseudosquare having a shape with dimensions such that four corners protrude outside the circle, and to use the remaining arcuate cells for formation of a module. In this case, the four protruding corners do not have material substance as a solar cell portion, the actual shape of the center cell obtained is a pseudosquare with four corners missing, and the arcuate cells obtained have a central angle of less than 90° and have a reduced area. When a diagonal length D' of a square with four corners completed is 0.98 to 1.02 times a diameter D of the disk-shaped solar cell, it is considered to belong to the 'square cell' and 'arcuate cell' concept. The lower limit value is allowed to be slightly smaller than 1 because a loss in dimensions due to cutting margin is taken into consideration. Even in this case, the central angle of the circular arc of the arcuate cell should be 90°.

Furthermore, D' is preferably 0.99 to 1.01 times D, and most preferably 1.0 times. That is, it is most preferable for the central angle of the arcuate cell to be 90°. This is because when the central angle of the arcuate cell is 90°, the square cell and the arcuate cells obtained can be used most efficiently.

The area of the arcuate cell used in the present invention is 28 to 65 cm$^2$, preferably 28 to 40 cm$^2$, and most preferably 28 to 32 cm$^2$.

The area of the arcuate cell used in the present invention depends on the diameter of the disk-shaped cell from which it is cut. With regard to the arcuate cell used in the present invention, it is preferable to obtain an arcuate cell by cutting a disk-shaped cell having a diameter of 200 to 300 mm, which can be produced efficiently, and it is more preferable to obtain it by cutting a disk-shaped cell having a diameter of 200 to 212 mm, which can be produced most efficiently.

In the present invention, a module in which second arcuate cells are arrayed is used, but it is also possible instead to apply a module having first arcuate cells arrayed to a photovoltaic power generation module and a photovoltaic power generation system, or the modules may be used in combination. Details of specific examples of the module are illustrated in the drawings and tables below.

The arcuate cell has not conventionally been utilized to a high degree, unlike the square cell. In particular, the second arcuate cell requires the provision of the busbar electrode on the wafer separately from the busbar electrode for the square cell, and this has prevented effective utilization of the arcuate cell.

Hereinafter, widths and intervals, etc. of the busbar and the grid are explained for a wafer having a diameter of 212 mm as one example. For wafers having a larger or smaller diameter, the shape may be changed proportionally thereto.

FIG. 2 shows one example of the three types of cell, that is, square cell 10, first arcuate cell 1, and second arcuate cell 2, which are divided by cutting lines denoted by the dotted lines in FIG. 1 from the photovoltaic power generation cell formed on the entire face of the disk-shaped single crystal silicon wafer.

Fine solid lines shown in FIG. 2 denote a grid 4, and four thick solid lines denote a busbar 3 perpendicular to the grid 4. In the case of a wafer having a diameter of 212 mm as one example, the cell 10 is a square cell having a side length of 150 mm (area 225 cm$^2$). One pair of arcuate cells 1 each have the grid 4 parallel to the chord and two busbars 3 perpendicular to the grid 4, and the other pair of arcuate cells 2 each have the grid 4 perpendicular to the chord and one busbar 3 perpendicular to the grid 4.

These two types of two pairs of arcuate cells 1 and 2 are all congruent with each other, and their area is about 32 cm$^2$. In reality, there is a small cutting margin for cutting the cells.

In this example, with regard to the second arcuate cell 2, an auxiliary electrode 5 provided along the inner edge of the circular arc in a region at either end of the cell is connected to the busbar 3. With regard to the first arcuate cell 1, an auxiliary electrode 5 provided along the inner edge of the circular arc in a middle section of the cell may be connected to the busbar 3.

Furthermore, in this example, the busbar 3 of the second arcuate cell 2 is provided parallel to the chord while running through the center of the maximum height of the arc.

With regard to the two busbars 3 of the first arcuate cell 1, they form two straight lines running through the square cell and the arcuate cells, and are provided at positions of ¼ and ¾ of the length of the chord (one side) so as to be perpendicular to the chord and form straight lines with the busbars 3 of the square cell 10.

Figure 3:
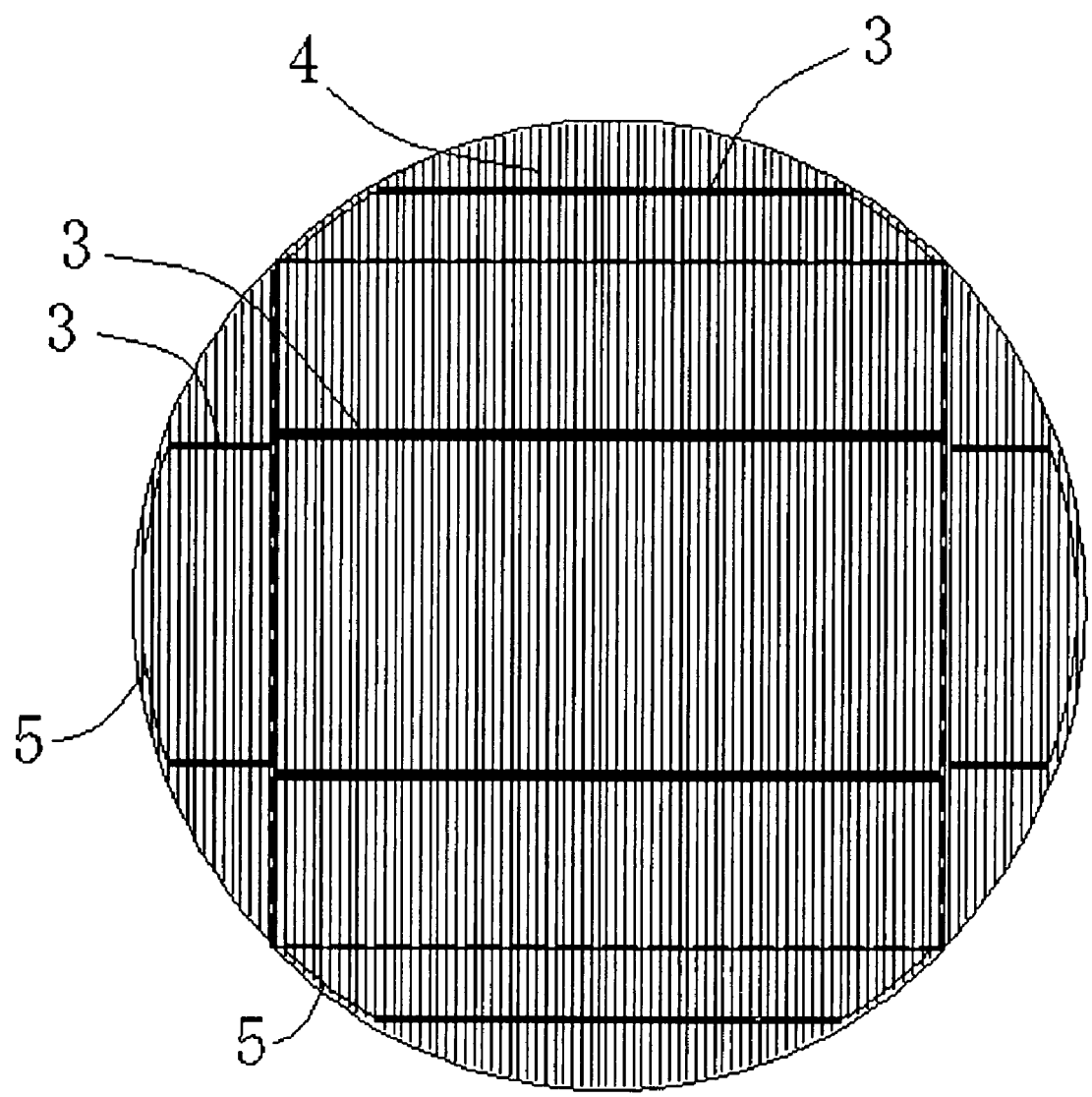
FIG. 3 is a schematic plan view showing another example of the photovoltaic power generation cell prior to cutting.

FIG. 3 is a schematic plan view showing another example of the photovoltaic power generation cell prior to cutting. In this figure the position and width of the busbar with respect to the square cell region and the arcuate cell regions are different from those of the example shown in FIG. 1 above.

Figure 4:
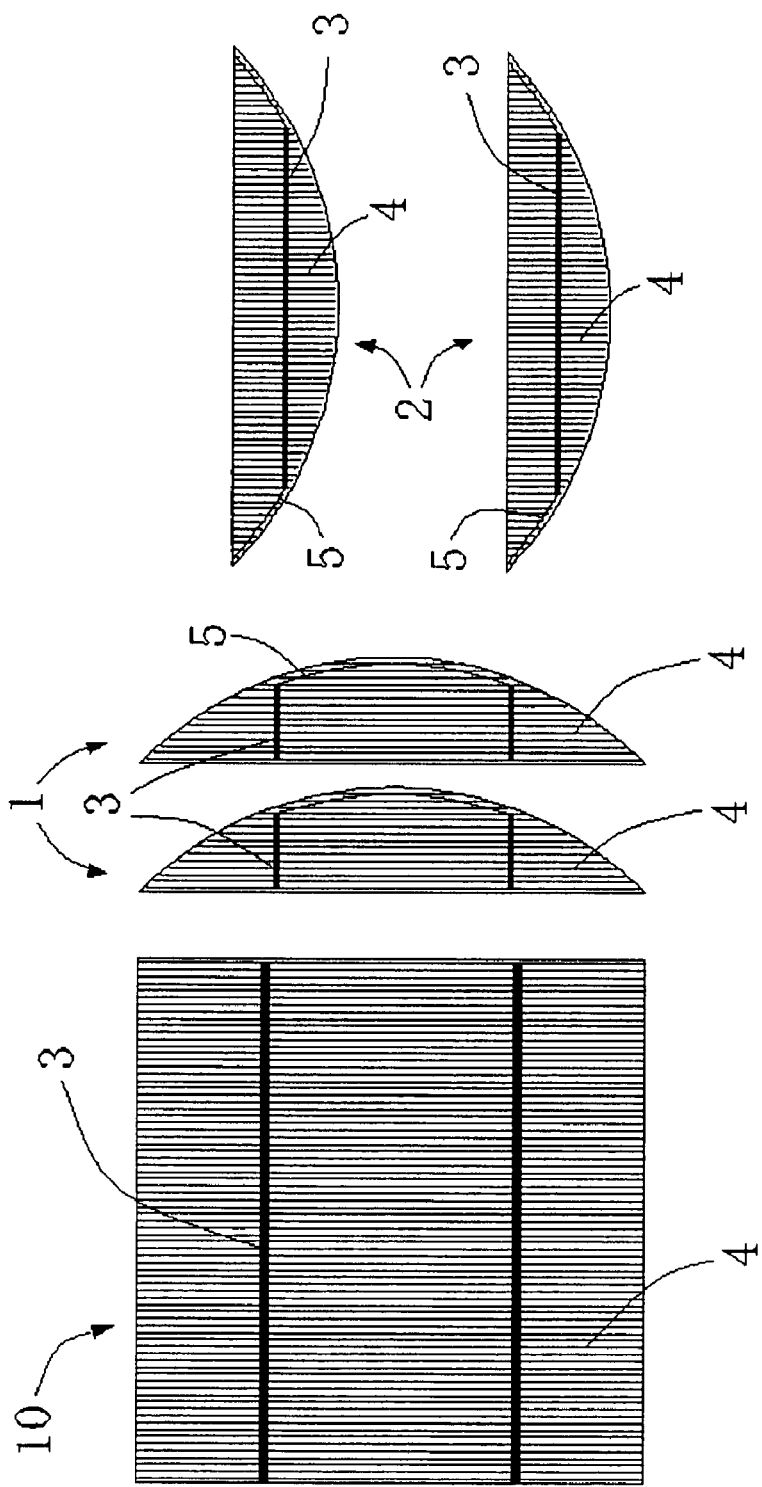
FIG. 4 is a schematic plan view showing one square cell and four arcuate cells obtained by cutting the photovoltaic power generation cell shown in FIG. 3.

As shown in FIG. 4, it is also preferable to provide busbars 3 for the first arcuate cell 1 at an interval smaller than that for the above-mentioned two busbars 3 provided on the square cell 10, and the width of the busbar may be smaller than that of the square cell. Furthermore, the current collected by the second arcuate cell 2 is 15% or less of the current collected by the square cell 10, and even by decreasing the cross section of the busbar it is possible to collect current adequately. It is preferable to reduce the width of the busbar electrode since the material of the busbar can be saved and the area of the cell that is shaded from sunlight can be reduced due to the width of the busbar being reduced, thus increasing the effective irradiated area.

In this example also, for both the first arcuate cell 1 and the second arcuate cell 2, auxiliary electrodes 5 are connected to the busbar electrodes 3, and the position and the shape thereof are similar to those shown in FIG. 2.

The arcuate cells thus obtained are arranged to produce a module. An outline of the Super Straight Method, which is a representative production process for a module, is explained. A plurality of cells that are electrically connected to each other in series have their light-receiving face side protected by a glass plate and a filler and their reverse faces protected by a moisture-resistant resin. A first step is a step of arraying cells on top of the glass and filler for protecting the front face, and carrying out wiring. Since a photovoltaic power generation module for outdoor power generation is required to have mechanical strength and light resistance, a material having high light transmittance and excellent impact strength is preferably used as the glass for protecting the front face, and specific examples thereof include a white tempered sheet glass. As the filler, a transparent resin is preferably used, and specific preferred examples thereof include polyvinyl butyral (PVB), which is resistant to ultraviolet rays, and ethylene/vinyl acetate copolymer (EVA), which has excellent moisture resistance.

A second step is a step of arraying photovoltaic power generation cells. The cells are arranged at intervals such that they are not in contact with each other and at the same time the packing ratio is increased. In a third step, the photovoltaic power generation cells are electrically connected in series by means of metal wires (tab wires). Examples of the metal wire between the cells include solder-dipped copper plate. This solder-dipped copper plate preferably has a thickness of 50 to 300 μm, and more preferably 120 to 200 μm, and its width is preferably 1.5 to 2.0 mm. In a fourth step, a protective sheet is affixed to the reverse face of the photovoltaic power generation cell. The reverse face protective sheet preferably employs a laminate sheet of a fluorocarbon resin, which has excellent corrosion resistance, and an aluminum thin plate for waterproofing.

In a fifth step, for the purpose of improving the mechanical strength and for installation, a frame (frame body) is fitted to the peripheral edge of the module. As the frame, a metal frame is preferable, and preferred examples thereof include light-weight aluminum with an angular U-shaped cross-section.

The thickness of module thus obtained is preferably 15 to 50 mm, more preferably 20 to 40 mm, and yet more preferably 25 to 40 mm.

The photovoltaic power generation module of the present invention is formed by arranging the second arcuate cells as a matrix so as to form a plurality of cell rows and a plurality of cell columns that are perpendicular to the plurality of cell rows.

Arrays of arcuate cells can be broadly divided into two representative arrays. One is an alternating single cell array (also called a 'first array') illustrated in FIG. 5 and the other is a staggered cell pair array (also called a 'second array') illustrated in FIG. 6.

Figure 5:
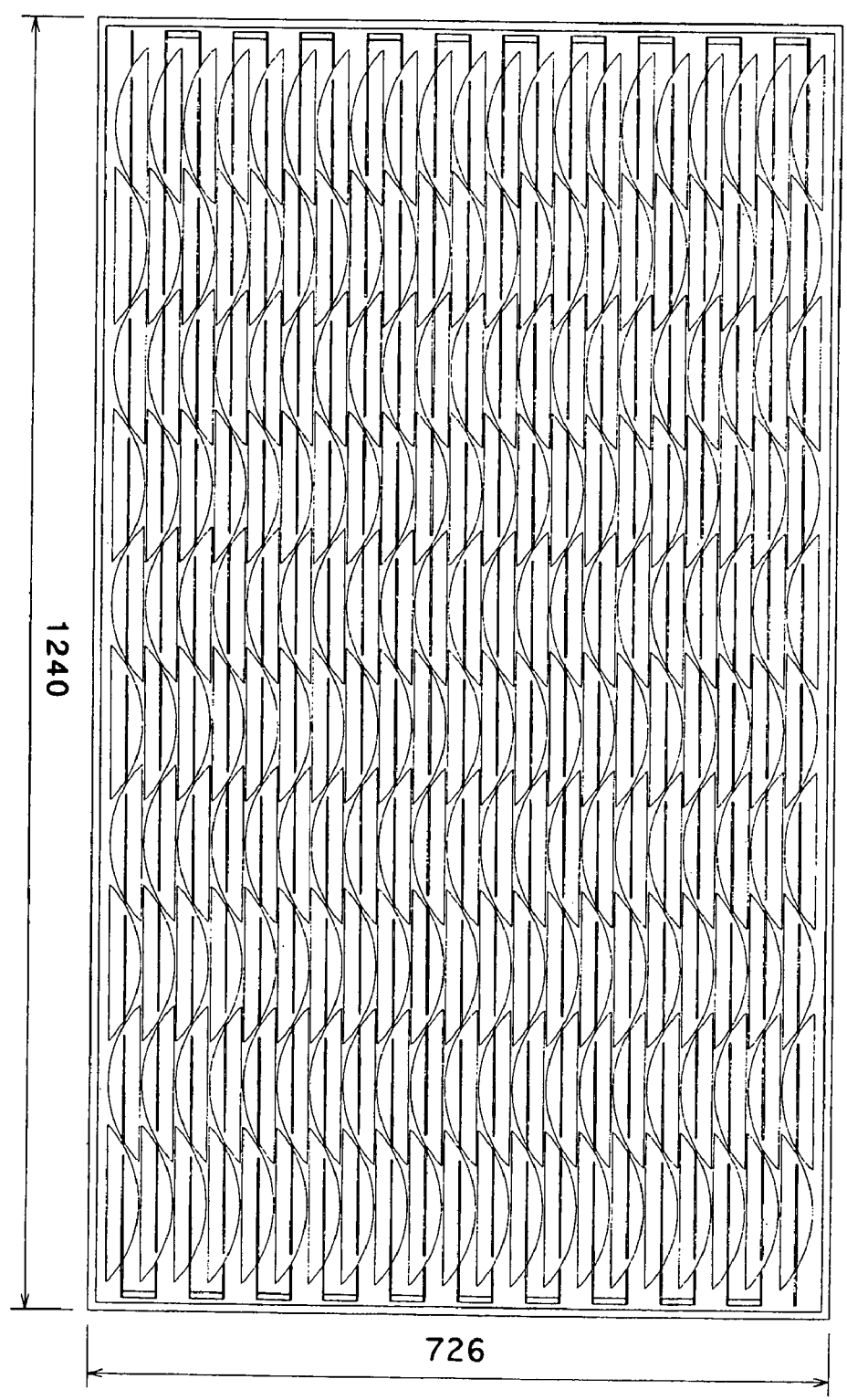
FIG. 5 is a schematic plan view showing one example of an alternating single cell array (first array) of a second arcuate cell.

FIG. 5 shows one example of the alternating single cell array (first array 20) of the second arcuate cell.

This cell array 20 is one example formed from 210 second arcuate cells; the cell rows are formed by reversing the chord-to-arc direction of adjacent arcuate cells, the cell columns are formed so that the chord-to-arc directions of adjacent arcuate cells are the same, and the module packing ratio is increased by arranging the arcuate cells as a matrix in a shape in which ends of arcuate cells forming one cell column enter the respective recessed region between adjacent cells forming the cell column adjacent to the above-mentioned cell column.

In other words, this array is the most densely packed array, in which arcuate cells are arrayed in a lattice pattern such that the chord and the circular arc alternate in the lateral direction (cell row direction) and the chord and the circular arc face the same direction in the longitudinal direction (cell column direction) and, moreover, adjacent cell columns are closely arranged at an appropriate cell interval.

With regard to the above-mentioned cell interval, it is preferable for the closest distance to be 1 to 3 mm, and about 2 mm (1.5 to 2.5 mm) is preferable.

Figure 6:
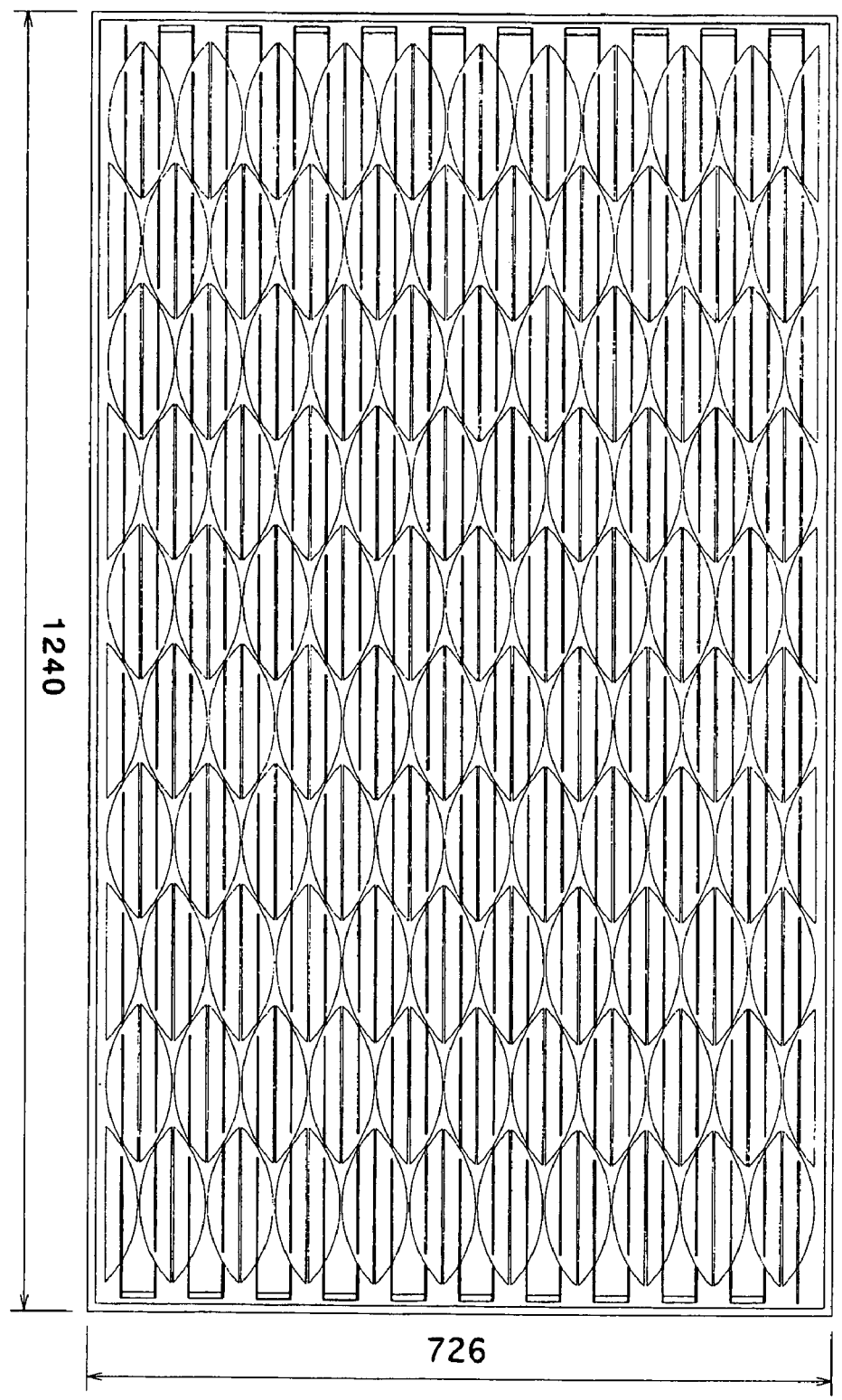
FIG. 6 is a schematic plan view showing one example of a staggered cell pair array (second array) of the second arcuate cell.

FIG. 6 shows one example of the staggered cell pair array (second array 30) of the second arcuate cell.

This cell array is one example formed similarly from 210 second arcuate cells; pairs of congruent arcuate cells are made to face each other at their chords to form paired cells (cell pairs), and the cell pairs are arrayed in a rectangular shape in a closest packed staggered state so that the chords are parallel to each other while maintaining appropriate cell intervals. By filling each gap formed on the edges at two sides parallel to the chord with one arcuate cell, the module packing ratio is thus increased.

With regard to the above-mentioned cell interval, it is preferable for the closest distance to be 1 to 3 mm, and about 2 mm (1.5 to 2.5 mm) is preferable.

The module of the present invention is a rectangular photovoltaic power generation module in which the second arcuate cells are arranged in the first array or the second array, and includes in its concept an equilateral square module. That is, as long as the four angles of the module are 90°, either a module having different lengths for two pairs of sides or a module having identical lengths for the two pairs of sides may be employed.

In the first array and the second array, it is preferable for the busbars provided on the second arcuate cells to be disposed substantially on one straight line. The busbars being disposed substantially on one straight line referred to here means that the busbars connected to each other can be considered to lie on one straight line. Here, 'substantially on one straight line' means that all of the busbars of the cells arranged in one line lie within a rectangular region having a width of two times, and preferably 1.5 times, the width of the busbar. Alternatively, it means that the angle formed between adjacent busbar electrodes is in the range of −5° to +5°, and preferably in the range of −3° to +3°.

In the present invention, a module packing ratio F is given by Formula (1) below.

$$F(\%) = (\text{total area occupied by cells/module plane area}) \times 100 \quad (1)$$

The module packing ratio depends on the number of cells arrayed in one module, and is preferably 50% to 85%. The module plane area referred to here means the outer dimensions of the module. As described above, an aluminum frame is generally set into the four sides of the module. Disposed on the inside of the frame is wiring (jumper ribbon) for providing an-electrical connection to a string (cells connected in a straight line). In a typical module, regardless of the outer dimensions thereof, there is a space for an aluminum frame having a width of 7 to 15 mm and a jumper ribbon having a width of on the order of 10 to 30 mm on the light-receiving face side, and at end faces parallel to the busbar cells are arrayed in the internal space at on the order of 5 to 15 mm away from the inner end of the frame. Therefore, when the closest distance of the arranged cells is constant, in general, the larger the outer dimensions of the module, the smaller the relative proportion of the regions formed on the four sides, thus enabling the module packing ratio to be increased.

In the module of the present invention, a large operating voltage per unit area (area voltage V/S) is preferable. The area voltage V/S is defined by Formula (2) below and is calculated.

$$V/S = \text{module operating voltage } (V)/\text{module plane area} (m^2) = (v \times f)/c \quad (2)$$

In the formula, v is the operating voltage (V) per cell, f is the module packing ratio, and c is the cell area ($m^2$).

The area voltage of the present invention is preferably 85 to 140 $V/m^2$.

As shown in Table 1 below, in a standard module (Reference Example 7) the area voltage is about 20 $V/m^2$, but in the modules of the present invention (Examples 1 to 6) it is 89 to 129 $V/m^2$.

The value for v is 0.5 to 0.6 V.

The operating voltage of the photovoltaic power generation module thus obtained may be set at a desired voltage according to the intended purpose by appropriately selecting the number of cells used. In a standard state (Air Mass 1.5, irradiation intensity 100 $mW/cm^2$, temperature 25° C.), an optimum operating voltage per cell is at least about 0.5 V; for example, in order to obtain an inverter input voltage of 210 V by means of one module, 420 cells may be arrayed. This voltage can be obtained by connecting 3 or less modules for modules having an operating voltage per module of 70 V or greater, which is one of preferred embodiments. Hereinafter, a photovoltaic power generation module with photovoltaic power generation cells having an operating voltage of 70 V or greater is also called a 'high voltage module'.

On the other hand, a photovoltaic power generation module having an array of 14 to 42 photovoltaic power generation cells and an operating voltage of 7 to 21 V is also called a 'low voltage module' below.

<Low Voltage Module>

The low voltage module of the present invention is a photovoltaic power generation module in which 14 to 42 second arcuate cells having a cell area of 28 to 65 $cm^2$ are arrayed. It is preferable to array 16 to 36 second arcuate cells, and more preferably 16 to 32 second arcuate cells. With these arrays, the low voltage modules have operating voltages of 7 to 21V, 8 to 18V, and 8 to 16V respectively.

Figure 7:
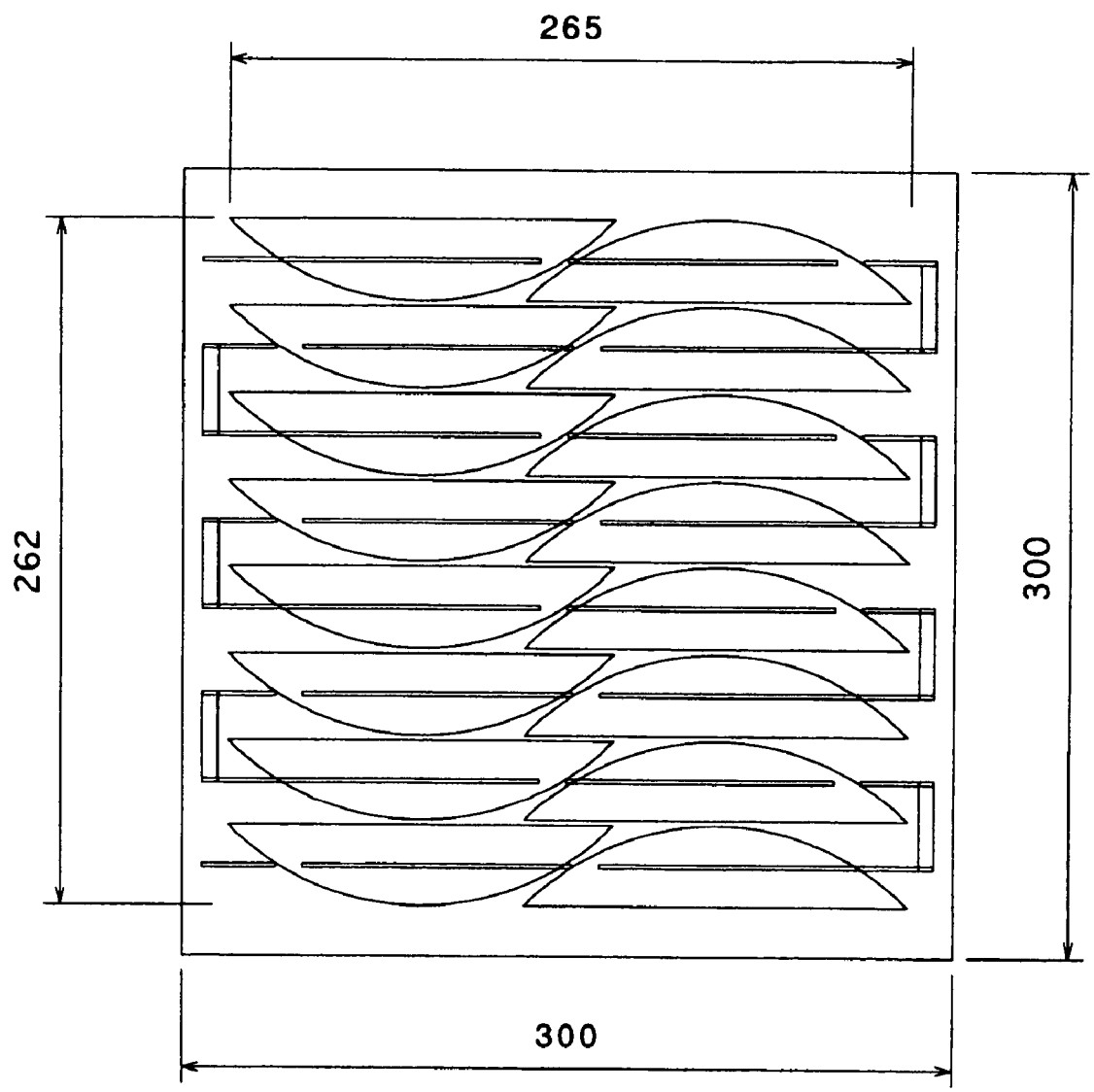
FIG. 7 is a schematic plan view showing one example of a low voltage module in which 16 second arcuate cells are arrayed in the first array.
Figure 8:
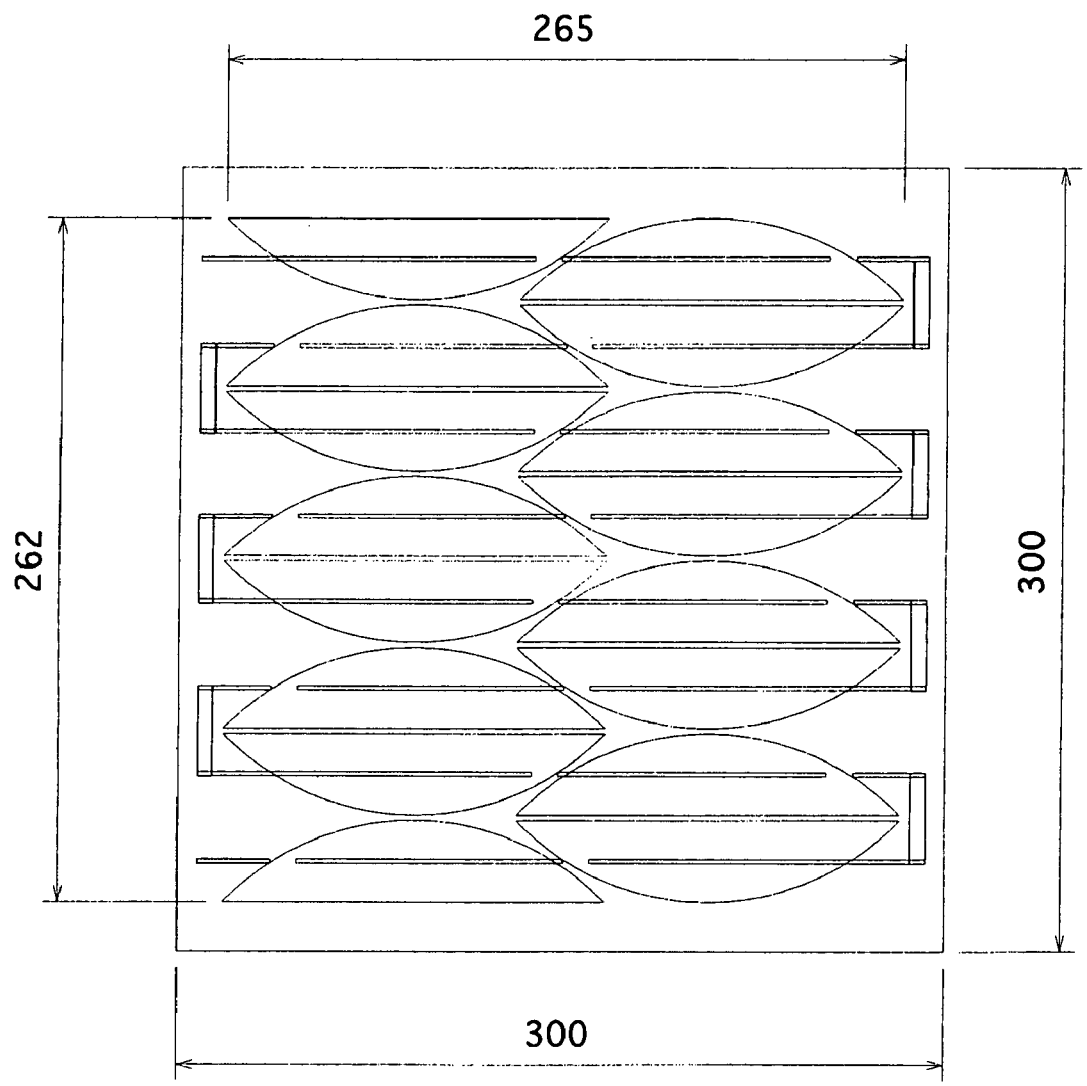
FIG. 8 is a schematic plan view showing one example of a module in which 16 second arcuate cells are arrayed in the second array.

FIG. 7 shows one example of the low voltage module having 16 second arcuate cells arrayed in the first array. FIG. 8 shows one example of the module similarly having 16 second arcuate cells arrayed in the second array. Both of the modules use arcuate cells having a central angle of 90° obtained from a disk-shaped wafer having a diameter of 212 mm, the operating voltage is 8 V, and the packing ratio is 56.9%. When the cell conversion efficiency is 15%, the maximum output is 7.7 W.

Since this low voltage module has a small area per module, the degree of freedom in installation increases. It can be applied to an installation location with a small area or a complicated shape, and as a result the coverage ratio can be improved. Furthermore, it is easy to carry out installation or maintenance since the low voltage module is small and lightweight.

A photovoltaic system having a desired input voltage may be obtained by forming an array by connecting a plurality of low voltage modules in series and further connecting these arrays in series.

<High voltage Module>

The high voltage module of the present invention is a photovoltaic power generation module having an array of 140 to 420 second arcuate cells having a cell area of 28 to 65 $cm^2$.

The operating voltage of the high voltage module is 70 to 210 V, and it is preferable to achieve an operating voltage corresponding to about 1/n (n being an integer of 1 to 3) of the input voltage of a currently used DC/AC inverter. In this case, by wiring n modules in series, a desired input voltage can be obtained. Specifically, it is preferable for the operating voltage of the high voltage module to be 210 V, 105 V, or 70 V.

FIG. 5 mentioned above is a schematic plan view showing one example of the high voltage module in which 210 second arcuate cells having a cell area of 32 $cm^2$ are arrayed in the first array. FIG. 6 is a schematic plan view showing one example of the high voltage module in which similarly 210 cells are arrayed in the second array. In these arrays, the closest distance between cells is about 2 mm (1.5 to 2.5 mm), the periphery is surrounded by an aluminum frame having a width of 7.5 mm, and there is a jumper ribbon space of 20 mm. Both of the modules have an area of 0.90 $m^2$, an operating voltage of 105 V, and a packing ratio of 74.6%. Furthermore, the area voltage is 117 $V/m^2$.

The module packed with second arcuate cells can have a high packing ratio, as shown in Table 1, compared with a module packed with the same number of first arcuate cells.

Figure 9:
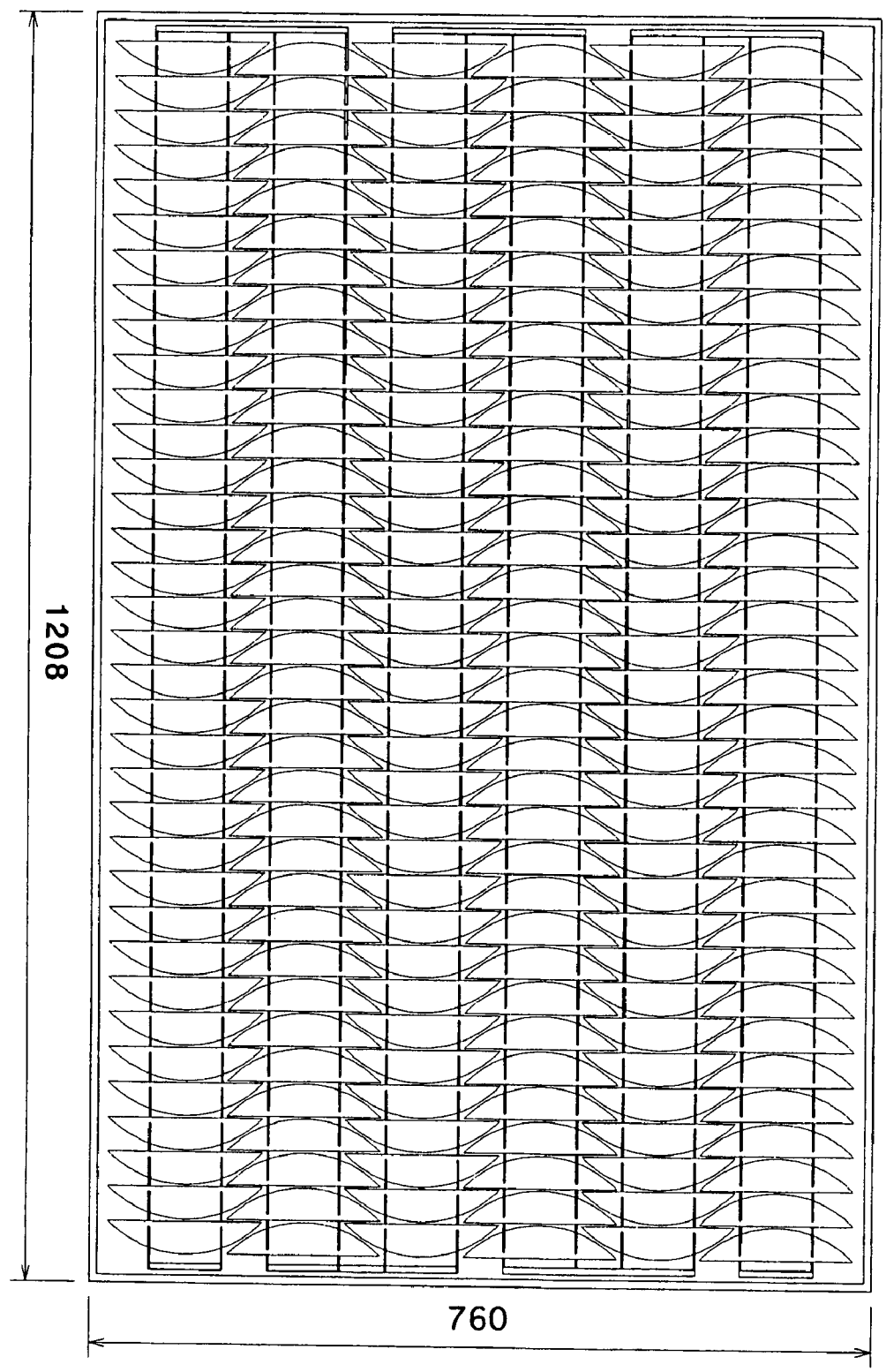
FIG. 9 is a schematic plan view (reference drawing) showing one example of a module in which 210 first arcuate cells are arrayed in the first array.

FIG. 9 is a schematic plan view (reference drawing) showing one example of a module in which 210 first arcuate cells are arrayed in the first array. The arcuate cells used have a cell area of 32 $cm^2$, and this module has a packing ratio of 73.2%.

Figure 10:
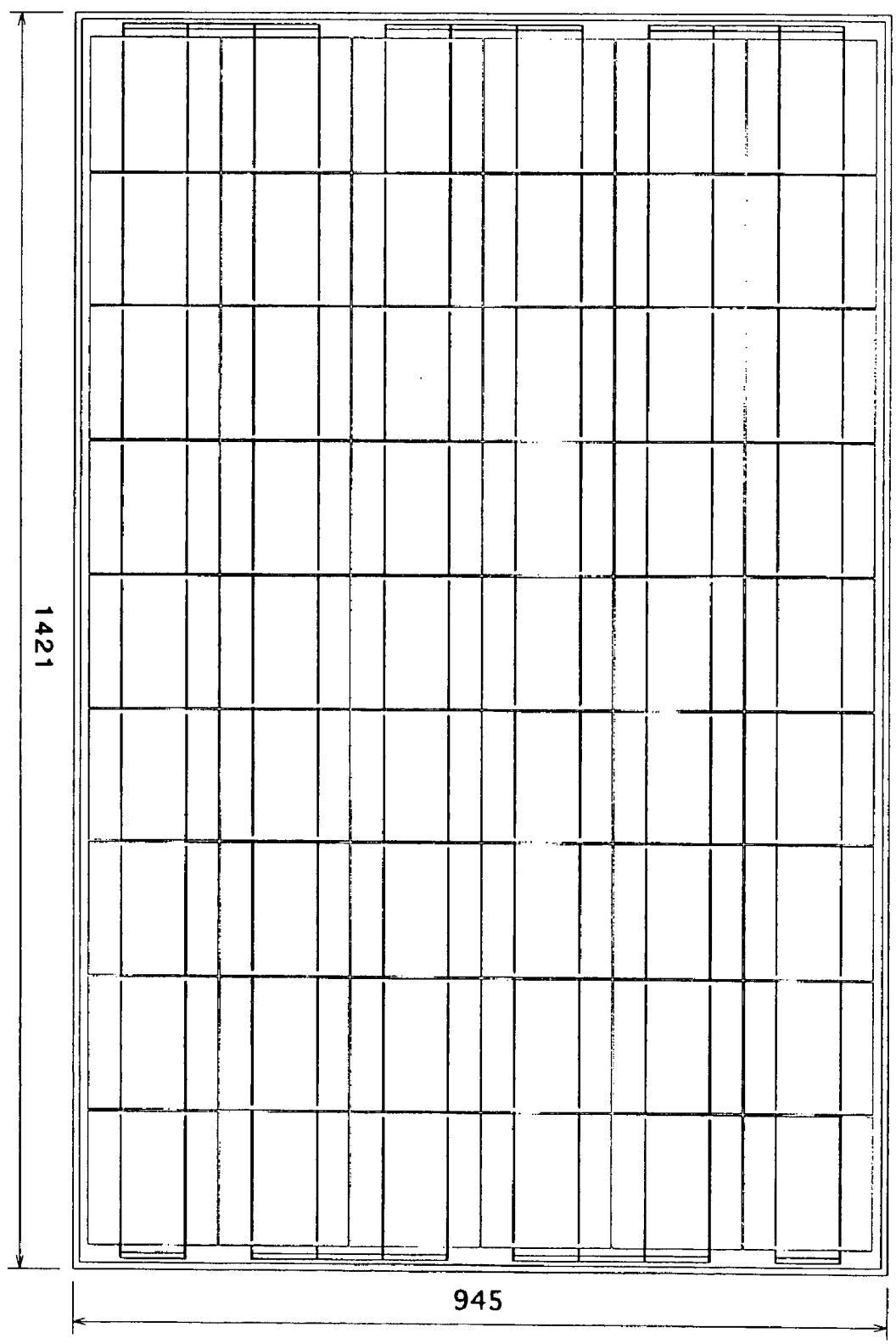
FIG. 10 is a schematic plan view (reference drawing) showing one example of a standard module in which 54 15-cm square cells are arrayed.

Furthermore, the high voltage module of the present invention can give a high area voltage compared with a module packed with square cells; in other words, it has a large operating voltage even for a small installation area. FIG. 10 is a schematic plan view (reference drawing) showing one example of a standard module in which 54 15-cm square cells are arrayed. This module has an area of 1.34 $m^2$ and an area voltage of 20.1 $V/m^2$. In order to obtain an-operating voltage of 210 V by making an array of only this type of module, 8 modules must be connected, and at least 10.7 $m^2$ is required as an installation area. The modules shown in FIG. 5 and FIG. 6 can give 210 V by connecting 2 thereof, and the installation area necessary is 1.80 $m^2$.

In this way, the high voltage module of the present invention is constituted using second arcuate cells, which have up until now been disposed of, and can give a high operating voltage with a smaller installation area compared with a standard module packed with square cells, and it is therefore possible to utilize effectively an installation location with a confined area and to improve the coverage ratio.

Since the module of the present invention has a small area compared with a conventional module, it can be applied to a more complicated shape. Furthermore, the low voltage module of the present invention may be arrayed in a lattice pattern so that the entirety forms a letter character. Examples of an arraying method include one described in a drawing of JP-A-2000-208805. This small-size module is effective for installation of a power generation system having a design effect on a roof.

Some embodiments of the low voltage module and the high voltage module are summarized in Table 1 below.

TABLE 1

| No. | Number of Cells | Operating Voltage (V) | Type of Arcuate Cell | Cell Array | Columns and Rows | Size (mm × mm) | V/S (V/m²) | Packing Ratio (%) |
|---|---|---|---|---|---|---|---|---|
| Ex. 1 | 16 | 8 | Second | First | 2 × 8 | 300 × 300 | 89 | 56.9 |
| Ref. Ex. 1 | 16 | 8 | First | First | 2 × 8 | 300 × 300 | 89 | 56.9 |
| Ex. 2 | 140 | 70 | Second | Second | 10 × 14 | 463 × 1173 | 129 | 82.5 |
| Ex. 3 | 210 | 105 | Second | First | 10 × 21 | 726 × 1240 | 117 | 74.6 |
| Ex. 4 | 210 | 105 | Second | Second | 10 × 21 | 726 × 1240 | 117 | 74.6 |
| Ex. 5 | 420 | 210 | Second | First | 14 × 30 | 1023 × 1700 | 121 | 77.3 |
| Ex. 6 | 420 | 210 | Second | Second | 14 × 30 | 1023 × 1700 | 121 | 77.3 |
| Ref. Ex. 2 | 140 | 70 | First | First | 4 × 35 | 491 × 1149 | 124 | 79.4 |
| Ref. Ex. 3 | 210 | 105 | First | First | 6 × 35 | 760 × 1208 | 114 | 73.2 |
| Ref. Ex. 4 | 210 | 105 | First | Second | 6 × 35 | 760 × 1208 | 114 | 73.2 |
| Ref. Ex. 5 | 420 | 210 | First | First | 10 × 42 | 1220 × 1439 | 120 | 76.4 |
| Ref. Ex. 6 | 420 | 210 | First | Second | 10 × 42 | 1220 × 1439 | 120 | 76.4 |
| Ref. Ex. 7 | 54 | 27 | Square Cell | Lattice | 6 × 9 | 945 × 1421 | 20.1 | 90.5 |

In Table 1, the arcuate cell area is 32 cm² in all cases (Examples 1 to 6 and Reference Examples 1 to 6), and the square cell area is 225 cm² (Reference Example 7). Calculation was carried out with a cell operating voltage of 0.5 V.

The present invention is a low voltage module with 14 to 42 arrays or a high voltage module with 140 to 420 arrays, but it may also be used as a medium voltage module with 43 to 139 arrays. Furthermore, it is also possible to use it as an ultrahigh voltage module with 500 or more arrays.

The photovoltaic power generation system is constructed by connecting the photovoltaic power generation modules to give a desired DA conversion voltage, and includes a solar inverter for converting the dc generated into ac. Furthermore, it may comprise a junction box for switching the output of a photovoltaic power generation array, a storage battery for storing electricity generated, etc.

The photovoltaic power generation system of the present invention comprises at least in part the module of the present invention employing the second arcuate cells. It may be a power generation system using only the module of the present invention for all of the modules or using in an appropriate combination with necessary numbers of a standard module employing square cells and a module employing the first arcuate cells.

Furthermore, it may be used in combination with a module having arrayed rectangular cells other than square cells (hereinafter, also called a 'rectangular cell module').

The photovoltaic power generation system of the present invention may be used as a small-scale, medium-scale, or large-scale photovoltaic power generation system. Examples of the small-scale photovoltaic power generation system include a few kW scale photovoltaic power generation system installed on a roof of an individual house. Examples of the medium-scale photovoltaic power generation system include a photovoltaic power generation system installed on a rooftop of a building having a large roof area, etc. (including a private office building or a public building such as a council building in a city), and the output thereof is normally 10 to several hundred kW. Examples of the large-scale photovoltaic power generation system include a photovoltaic power generating station.

Among them, the module of the present invention is preferably used in the small-scale photovoltaic power generation system; it is particularly preferably used in a domestic photovoltaic power generation system on the roof of a house and, for example, it may be installed preferably on the roof of an individual house.

Furthermore, in the case of it being used in the small-scale photovoltaic power generation system, an inverter does not have to be used, and direct current outputted may be used without being converted into alternating current. Specific embodiments thereof include installing it on the hood, trunk panel, or roof (top) of an automobile (a bus or various types of vehicle) in order to charge a storage battery. As an installation location, there is the top in a broad sense, which includes a roof.

Figure 11:
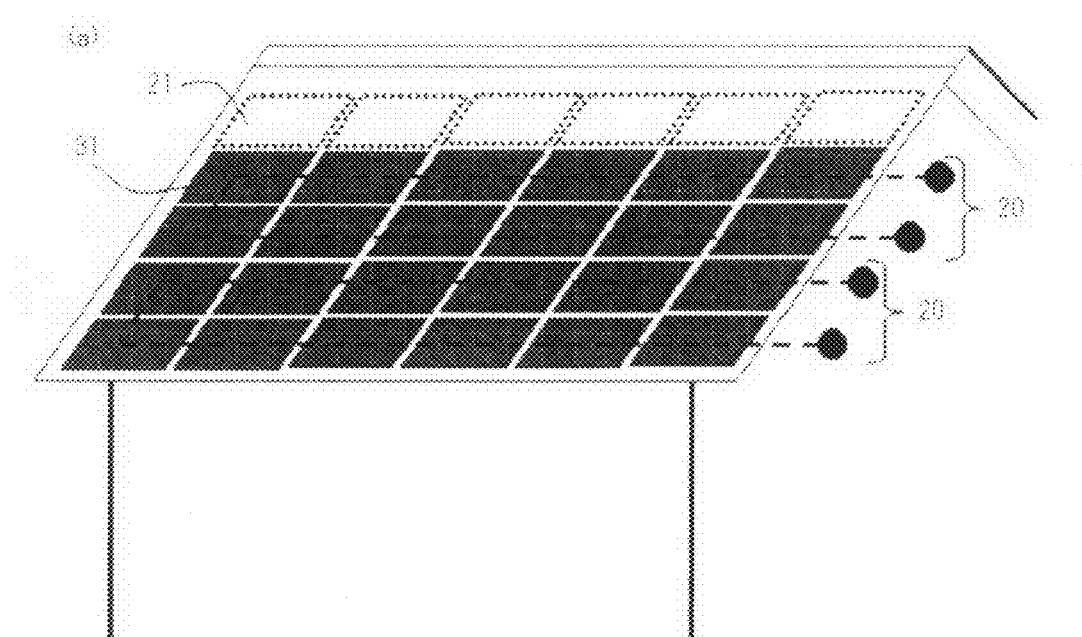
FIG. 11(a) is a schematic plan view (reference drawing) showing an example of the constitution of a photovoltaic power generation system in which square standard cell modules are arranged.
FIG. 11(b) is a schematic plan view showing an example of the constitution of a photovoltaic power generation system in which only the arcuate cell modules of the present invention are arranged.
Figure 11:
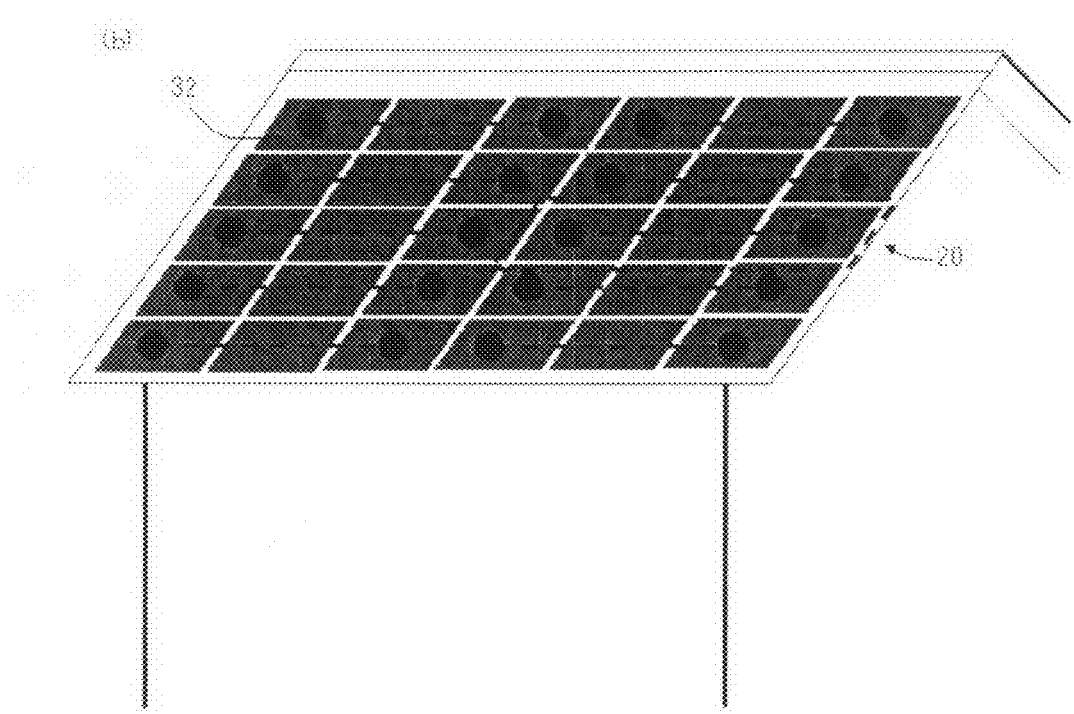

FIG. 11(a) is an example of the constitution of a photovoltaic power generation system in which standard square cell modules 31 are arranged. For the standard cell modules 31, which have a low area voltage, it is necessary to employ a large area for a photovoltaic power generation array 20, and as a result it is often observed that there is a region in which the array 20 cannot be installed (a dead space 21).

By arranging the array employing the module of the present invention, which has a high area voltage, such dead space can be reduced, thereby improving the module coverage ratio. Such a photovoltaic system is preferable since a larger output can be achieved as a consequence.

The photovoltaic power generation system of the present invention is also preferably a photovoltaic power generation system in which the arcuate cell modules are arranged in all parts thereof. FIG. 11(b) is an example of the constitution of a photovoltaic power generation system in which only arcuate cell modules 32 are arranged. In order to obtain a desired operating voltage, which is the input voltage of a dc/ac inverter, the modules may be interconnected.

Specifically, as shown in FIG. 11(b), an array 20 may be constructed by connecting three modules having an output voltage of 70 V, and a photovoltaic power generation system may be constructed by connecting the electricity obtained from the array to a dc/ac inverter.

Figure 12:
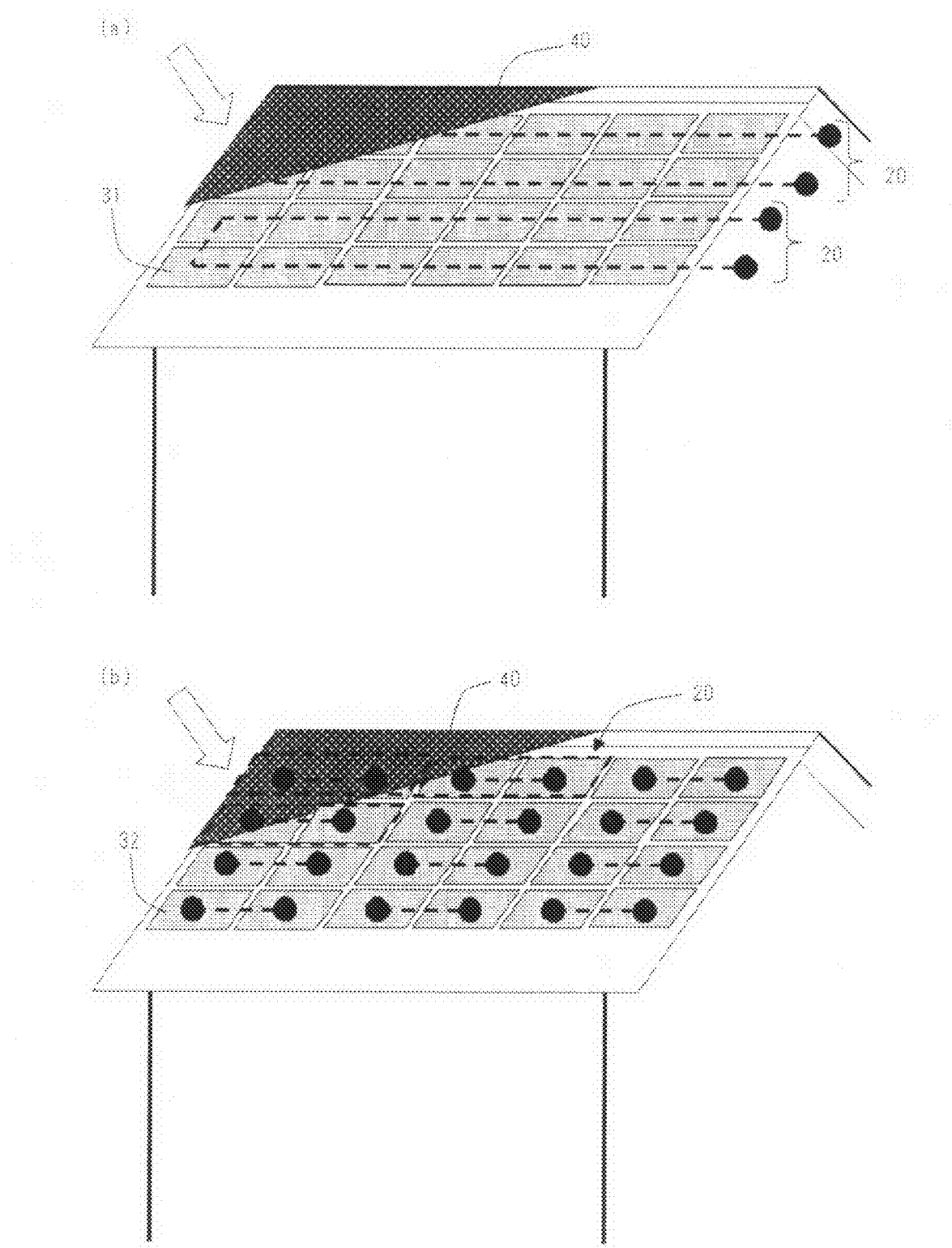
FIG. 12(a) schematic plan view (reference drawing) showing an example of the constitution of a photovoltaic power generation system in which the array is constructed from conventional standard modules.
FIG. 12(b) is a schematic plan view showing an example of the constitution of a photovoltaic power generation system in which the array is constructed from the high voltage modules of the present invention.

FIG. 12(a) is an example of the constitution of a photovoltaic power generation system in which an array 20 is constructed from conventional standard modules 31, showing a case in which a standard photovoltaic power generation module having an optimum operating voltage of 17.5 V is used and two arrays comprising 12 modules in series are connected in parallel. As shown in the figure, when a shadow 40 occurs temporarily during the daytime due to a neighboring building, etc., 4 modules among the upper series of 12 have a decreased voltage. As a result, a DA inverter input voltage cannot be obtained from the upper 12 modules in series, it is only the lower series of 12 modules that contributes to power generation, and the amount of power generated decreases by a maximum of about 50%.

FIG. 12(b) is an example of the constitution of a photovoltaic power generation system in which an array 20 is constructed from the high voltage modules 32 of the present invention, two of which can give an optimum operating voltage of 210 V. When a shadow 40 occurs temporarily during the daytime in the same manner as in the above-mentioned example, 6 modules cannot contribute to power generation. However, the remaining 18 modules are not affected by the shadow, and the reduction in the amount of power generated is at most about 25%.

When the array is constituted from the arcuate cell modules in this way, compared with a case in which an array is constituted from standard modules, the loss-due to the influence of shade can be greatly-reduced. Furthermore, when an array is constructed from standard modules, no module in most cases is disposed in a section of a roof that is shaded even temporarily during the daytime, which causes a reduction in the coverage ratio. With regard to the module of the present invention, even if it is disposed in a section that is shaded temporarily during the daytime, only the arrays in the section that is shaded are affected, and the module can be disposed in a section of a roof where it has been impossible to dispose a module. The photovoltaic power generation system formed from the modules of the present invention can increase the amount of power generated through the day and is advantageous compared with a photovoltaic power generation system formed from standard modules.

Furthermore, by disposing the module having a high area voltage of the present invention on a roof with a section that is shaded temporarily during the daytime, the amount of power generated through the day can be increased.

The photovoltaic power generation system of the present invention is also preferably a photovoltaic power generation system in which the low voltage modules of the present invention and a necessary number of modules having 14 to 42 first arcuate cells of 28 to 65 cm$^2$ arrayed in the first array or the second array are arranged.

It is preferable to array 16 to 36 first arcuate cells, and it is more preferable to array 16 to 32 first arcuate cells.

Furthermore, the photovoltaic power generation system of the present invention is also preferably a photovoltaic power generation system in which the high voltage modules of the present invention and a necessary number of modules having 140 to 440 first arcuate cells of 28 to 65 cm$^2$ arrayed in the first array or the second array are arranged. In this case, it is preferable to set the operating voltage of the module having the first arcuate cells arrayed at an operating voltage corresponding to about 1/n (n being an integer of 1 to 3) of the input voltage of an inverter.

Specifically, it is preferable for the operating voltage of the high voltage module to be 210 V, 105 V, or 70 V.

With regard to the module having the above-mentioned first arcuate cells arrayed, it is preferable to array them under the same conditions as those for the second arcuate cells. For example, it is preferable for busbars to be disposed on a substantially straight line, and the interval between cells, the width of busbar provided, etc. are preferably the same as those for the second arcuate cells.

As hereinbefore described, the present invention can reduce the loss from a single crystal wafer by the use of arcuate cells, which have not been utilized effectively, and in particular by the use of second arcuate cells. Furthermore, since the area voltage is high compared with a conventional module, a high coverage ratio can be achieved. The present invention is not limited to the Examples and can naturally be modified in a variety of ways as long as the modifications stay within the spirit and scope of the present invention.

It should be noted that an embodiment in which two or more preferred embodiments of the present invention are combined is more preferable.

What is claimed is:

1. A photovoltaic power generation module having a rectangular shape, the module comprising:
    arcuate cells divided from a disk-shaped single crystal silicon photovoltaic power generation cell, wherein
    the arcuate cells have a circular arc with a central angle of 90°,
    the arcuate cells have a grid perpendicular to a chord and at least one busbar perpendicular to the grid and parallel to the chord,
    the arcuate cells are arranged as a matrix so as to form a plurality of cell rows and a plurality of cell columns perpendicular thereto,
    the cell rows are formed by reversing the chord-to-arc direction of adjacent arcuate cells,
    the cell columns are formed so that the chord-to-arc directions of adjacent arcuate cells are the same,
    the arcuate cells are arrayed so that ends of arcuate cells forming one cell column enter respective recessed regions between adjacent cells forming the cell column adjacent to the above cell column,
    the arcuate cells have an area of 28 to 65 cm$^2$, 14 to 42 thereof being arrayed, and
    the arcuate cells have an auxiliary electrode extending from the busbar so as to intersect the grid within a region in which the grid provided on the arcuate cell does not intersect the busbar.

2. The photovoltaic power generation module according to claim 1, wherein the busbars of the arcuate cells are arranged in a substantially straight line.

3. A photovoltaic power generation module having a rectangular shape, the module comprising:
    arcuate cells divided from a disk-shaped single crystal silicon photovoltaic power generation cell, wherein
    the arcuate cells have a circular arc with a central angle of 90°,
    the arcuate cells have a grid perpendicular to a chord and at least one busbar perpendicular to the grid,
    the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord,
    the arcuate cells have an area of 28 to 65 cm$^2$, 14 to 42 thereof being arrayed, and
    the arcuate cells have an auxiliary electrode extending from the busbar so as to intersect the grid within a region in which the grid provided on the arcuate cell does not intersect the busbar.

4. The photovoltaic power generation module according to claim 3, wherein the busbars of the arcuate cells are arranged in a substantially straight line.

5. A photovoltaic power generation module having a rectangular shape, the module comprising:
arcuate cells divided from a disk-shaped single crystal silicon photovoltaic power generation cell, wherein
the arcuate cells have a circular arc with a central angle of 90°,
the arcuate cells have a grid perpendicular to a chord and at least one busbar perpendicular to the grid and parallel to the chord,
the arcuate cells are arranged as a matrix so as to form a plurality of cell rows and a plurality of cell columns perpendicular thereto,
the cell rows are formed by reversing the chord-to-arc direction of adjacent arcuate cells,
the cell columns are formed so that the chord-to-arc directions of adjacent arcuate cells are the same,
the arcuate cells are arrayed so that ends of arcuate cells forming one cell column enter respective recessed regions between adjacent cells forming the cell column adjacent to the above cell column,
the arcuate cells have an area of 28 to 65 cm$^2$, 140 to 440 thereof being arrayed, and
the arcuate cells have an auxiliary electrode extending from the busbar so as to intersect the grid within a region in which the grid provided on the arcuate cell does not intersect the busbar.

6. The photovoltaic power generation module according to claim 5, wherein the busbars of the arcuate cells are arranged in a substantially straight line.

7. A photovoltaic power generation system, wherein the photovoltaic power generation module according to claim 1 is disposed in at least one part thereof.

8. A photovoltaic power generation system, comprising:
a first photovoltaic power generation module having
arcuate cells divided from a disk-shaped single crystal silicon photovoltaic power generation cell, wherein the arcuate cells have a circular arc with a central angle of 90°, the arcuate cells have a grid perpendicular to a chord and at least one busbar perpendicular to the grid and parallel to the chord, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, the arcuate cells have an area of 28 to 65 cm$^2$, 14 to 42 thereof being arrayed, and the arcuate cells have an auxiliary electrode extending from the busbar so as to intersect the grid within a region in which the grid provided on the arcuate cell does not intersect the busbar;
and
a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to a chord and at least two busbars perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm$^2$, 14 to 42 thereof being arrayed,
or a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm$^2$, 14 to 42 thereof being arrayed.

9. A photovoltaic power generation system, comprising:
a first photovoltaic power generation module having
arcuate cells divided from a disk-shaped single crystal silicon photovoltaic power generation cell, wherein the arcuate cells have a circular arc with a central angle of 90°, the arcuate cells have a grid perpendicular to a chord and at least one busbar perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, the arcuate cells have an area of 28 to 65 cm$^2$, 14 to 42 thereof being arrayed, and the arcuate cells have an auxiliary electrode extending from the busbar so as to intersect the grid within a region in which the grid provided on the arcuate cell does not intersect the busbar;
and
a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to a chord and at least two busbars perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm$^2$, 14 to 42 thereof being arrayed,
or a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm$^2$, 14 to 42 thereof being arrayed.

10. A photovoltaic power generation system, comprising:
a first photovoltaic power generation module having arcuate cells divided from a disk-shaped single crystal silicon photovoltaic power generation cell, wherein the arcuate cells have a circular arc with a central angle of 90°, the arcuate cells have a grid perpendicular to a chord and at least one busbar perpendicular to the grid and parallel to the chord, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, the arcuate cells have an area of 28 to 65 cm$^2$, 140 to 440 thereof being arrayed, and the arcuate cells have an auxiliary electrode extending from the busbar so as to intersect the grid within a region in which the grid provided on the arcuate cell does not intersect the busbar;
and
a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to a chord and at least two busbars perpendicular to the grid, the arcuate cells are arranged as a matrix so as to form a plurality of cell rows and a plurality of cell columns perpendicular thereto, the cell rows are formed by reversing the chord-to-arc direction of adjacent arcuate cells, the cell columns are formed so that the chord-to-arc directions of adjacent arcuate cells are the same, the arcuate cells are arrayed so that ends of arcuate cells forming one cell column enter respective recessed regions between adjacent cells forming the cell column adjacent to the above cell column, and the arcuate cells have an area of 28 to 65 cm$^2$, 140 to 440 thereof being arrayed, or a second photovoltaic power generation module having a rectangular shape, the module comprising arcuate cells divided from a disk-shaped single crystal silicon photovoltaic power generation cell, wherein the arcuate cells have a circular arc with a central angle of 90°, the arcuate cells have a grid parallel to the chord and at least two busbars perpendicular to the grid, the photovoltaic power generation module has an array in which two arcuate cells face each other at the chords to form a cell pair, the cell pairs being arrayed in parallel to each other in a staggered state so as to form a rectangle, and one arcuate cell filling a gap formed on edges of two sides parallel to the chord, and the arcuate cells have an area of 28 to 65 cm$^2$, 140 to 440 thereof being arrayed.

11. A photovoltaic power generation system, comprising one or more of the modules according to claim 1, and a solar inverter electrically connected to the one or more modules, the one or more modules being fixed to a roof.

12. A photovoltaic power generation system, comprising one or more of the modules according to claim 3 and a solar inverter electrically connected to the one or more modules, the one or more module being fixed to a roof.

13. A photovoltaic power generation system comprising one or more of the modules according to claim 5 and a solar inverter electrically connected to the one or more modules, the one or more module being fixed to a roof.

14. The photovoltaic power generation system according to claim 11, wherein it is of a grid connection type.

15. The photovoltaic power generation system according to claim 12, wherein it is of a grid connection type.

16. The photovoltaic power generation system according to claim 13, wherein it is of a grid connection type.

* * * * *